(12) United States Patent
Shirai et al.

(10) Patent No.: US 10,763,724 B2
(45) Date of Patent: Sep. 1, 2020

(54) SENSOR UNIT

(71) Applicant: NIDEC TOSOK CORPORATION, Kanagawa (JP)

(72) Inventors: Hiroshi Shirai, Kanagawa (JP); Toshiaki Nakamura, Kanagawa (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 0 days.

(21) Appl. No.: 16/504,318

(22) Filed: Jul. 7, 2019

(65) Prior Publication Data
US 2020/0021164 A1 Jan. 16, 2020

(30) Foreign Application Priority Data

Jul. 10, 2018 (JP) .................. 2018-130896

(51) Int. Cl.
| H02K 5/22 | (2006.01) |
| H02K 29/08 | (2006.01) |
| H02K 11/215 | (2016.01) |
| G01R 33/02 | (2006.01) |
| H02B 1/20 | (2006.01) |

(52) U.S. Cl.
CPC ............ *H02K 5/225* (2013.01); *G01R 33/02* (2013.01); *H02B 1/20* (2013.01); *H02K 11/215* (2016.01); *H02K 29/08* (2013.01); *H02K 2203/09* (2013.01)

(58) Field of Classification Search
CPC .................................. H02K 5/22; H02K 11/33
USPC ................... 310/68 B, 68 D, 68 R, 71, 203
See application file for complete search history.

(56) References Cited

U.S. PATENT DOCUMENTS

| 9,756,755 B2* | 9/2017 | Harada ................ H05K 7/1432 |
| 10,175,269 B2* | 1/2019 | Oka .................... G01R 15/183 |
| 2007/0257659 A1* | 11/2007 | Nomoto .............. G01R 15/202 324/76.11 |
| 2009/0002974 A1* | 1/2009 | Yahata ................... B60L 15/20 361/820 |
| 2011/0068771 A1* | 3/2011 | Ueno .................. G01R 15/202 324/117 R |
| 2013/0028001 A1* | 1/2013 | Yokota .................. H02M 7/003 363/144 |
| 2014/0126154 A1* | 5/2014 | Higuchi ............. H05K 7/20927 361/714 |
| 2015/0016063 A1* | 1/2015 | Higuma ................ H05K 7/209 361/714 |

(Continued)

FOREIGN PATENT DOCUMENTS

WO 2009113633 9/2009

*Primary Examiner* — Jose A Gonzalez Quinones
(74) *Attorney, Agent, or Firm* — JCIPRNET

(57) ABSTRACT

The sensor unit (40) includes a case (41) having a bottom surface (41a); a sensor element (42) including a sensor element main body (421) and a power supply terminal (42a); and a power supply bus bar (44) including an inclined part (44d) and a first connection part (44a). An end on one side of the power supply terminal (42a) is electrically connected to the sensor element main body (421). In a state where the power supply terminal (42a) passes through the first connection part (44a), an end on the other side of the power supply terminal (42a) is in contact with the inclined part (44d) and the first connection part (44a) is in contact with the power supply terminal (42a), so that movement of the power supply terminal (42a) in a direction away from the bottom surface (41a) is restricted.

9 Claims, 9 Drawing Sheets

(56) References Cited

U.S. PATENT DOCUMENTS

2016/0072368 A1\* 3/2016 Uchimura .......... H02K 11/0094
    310/71
2017/0317006 A1\* 11/2017 Okumura .......... H01L 23/49568

\* cited by examiner

SENSOR UNIT

CROSS REFERENCE TO RELATED APPLICATION

This application claims the priority benefit of Japanese Patent Application No. 2018-130896, filed on Jul. 10, 2018. The entirety of the above-mentioned patent application is hereby incorporated by reference herein and made a part of this specification.

BACKGROUND

Technical Field

The disclosure relates to a sensor unit.

Description of Related Art

A bus bar and a conductive wire (terminal) are generally joined by welding (see Patent Document 1, for example). In Patent Document 1, in order to ensure a wide region for connecting the bus bar and the conductive wire, a terminal wall is formed on the peripheral edge of a through hole, through which the conductive wire passes. However, in such a configuration, the conductive wire is neither pressed into the through hole nor caulked. Therefore, pinholes may be formed in the welded part between the bus bar and the conductive wire and reduce the connection reliability between the bus bar and the terminal.

RELATED ART

Patent Document

[Patent Document 1] Re-publication of PCT International Publication No. 2009/113633

The disclosure provides a sensor unit that achieves high connection reliability between the bus bar and the terminal of the sensor element.

SUMMARY

A sensor unit according to an embodiment of the disclosure includes: a case having a bottom surface that includes a mounting surface, and a side wall that surrounds the bottom surface; a sensor element including a sensor element main body and a terminal; and a bus bar including an inclined part and a terminal passage part and fixed in the case. The sensor element main body is mounted on the mounting surface in a state of being restricted from moving in a direction parallel to the mounting surface, and an end on one side of the terminal is electrically connected to the sensor element main body. The inclined part is inclined with respect to the mounting surface. The terminal passes through the terminal passage part. In a state where the terminal passes through the terminal passage part, an end on the other side of the terminal is in contact with the inclined part and the terminal passage part is in contact with a side surface of the terminal, so that movement of the terminal in a direction away from the bottom surface is restricted.

DESCRIPTION OF THE EMBODIMENTS

According to an embodiment of the disclosure, it is possible to connect the bus bar and the terminal of the sensor element with high connection reliability.

In each figure, the Z axis direction is defined as the vertical direction Z. The X axis direction is defined as the left-right direction X, among the horizontal directions orthogonal to the vertical direction Z. The Y axis direction is defined as the axial direction Y orthogonal to the left-right direction X, among the horizontal directions orthogonal to the vertical direction Z. The positive side of the vertical direction Z is called the "upper side" and the negative side is called the "lower side". The positive side of the axial direction Y is called the "front side" and the negative side is called the "rear side". The front side corresponds to one side and the rear side corresponds to the other side. Nevertheless, the upper side, lower side, front side, rear side, vertical direction, and left-right direction are simply names for describing the relative positional relationship between the parts, and the actual arrangement relationship may be different from the arrangement relationship indicated by these names.

Figure 1:
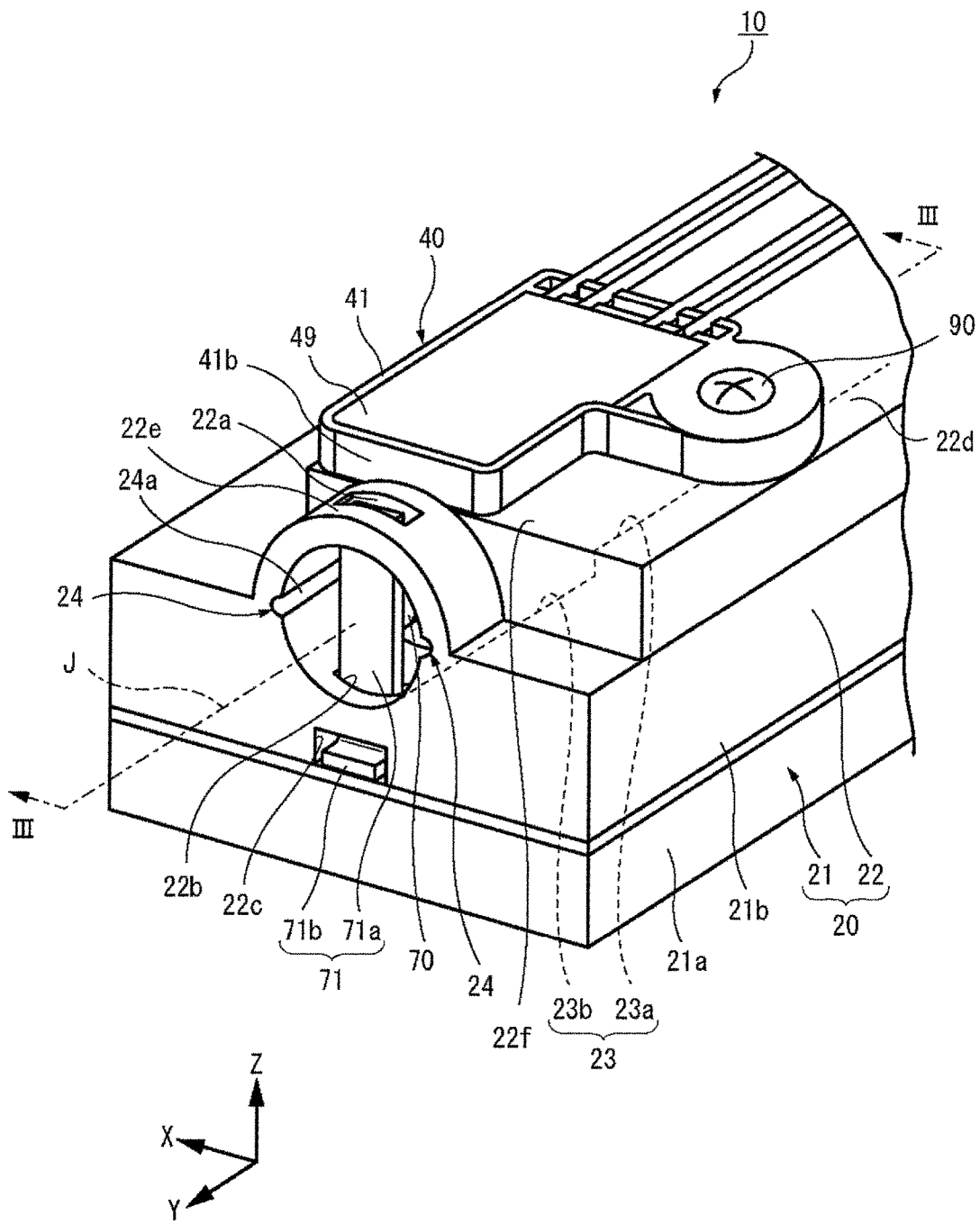
FIG. 1 is a perspective view showing a configuration of the valve device mounted with the sensor unit according to an embodiment of the disclosure.
Figure 2:
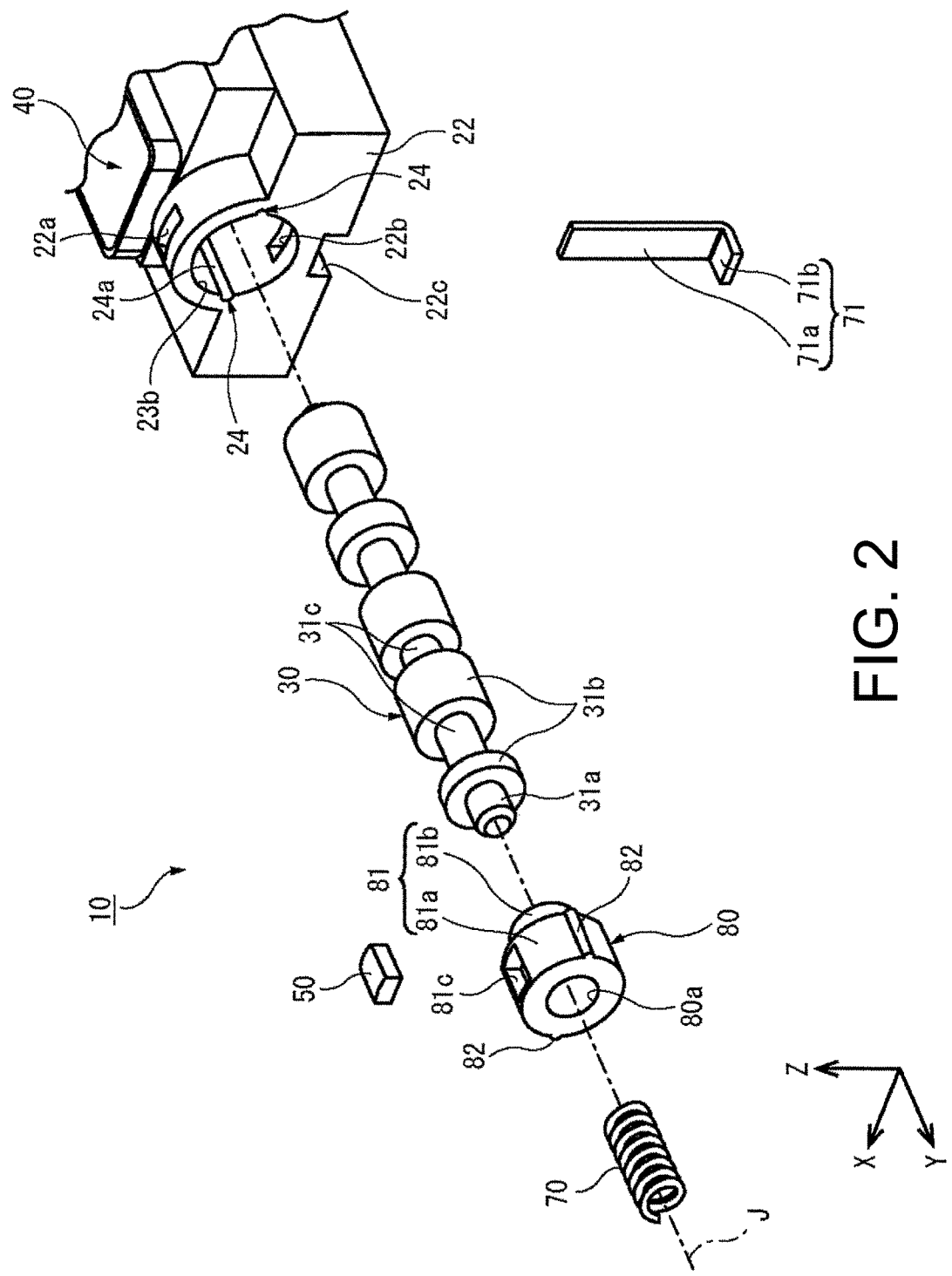
FIG. 2 is an exploded perspective view showing a configuration of the valve device mounted with the sensor unit according to an embodiment of the disclosure.
Figure 3:
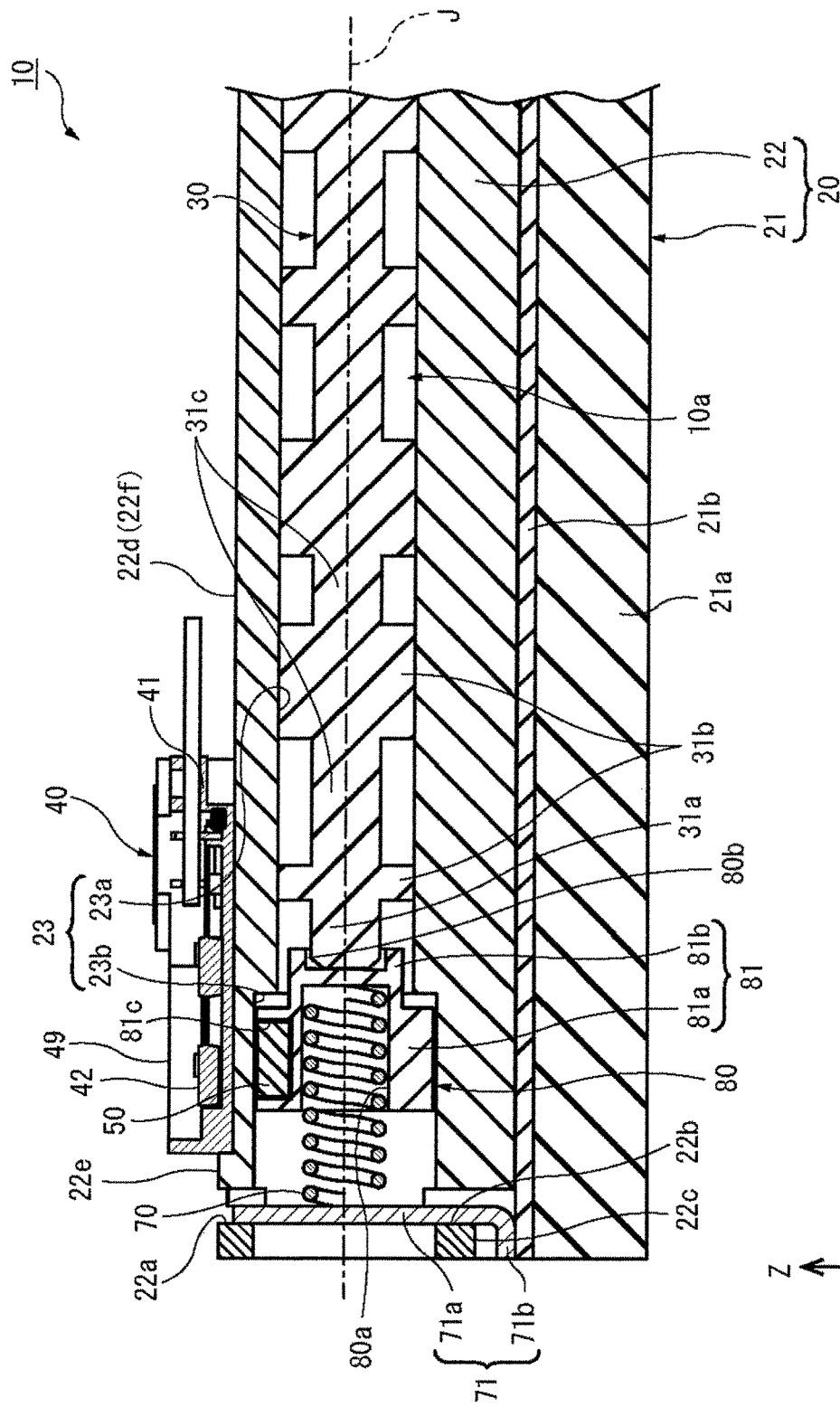
FIG. 3 is a cross-sectional view taken along the line III-III of FIG. 1, showing a configuration of the valve device mounted with the sensor unit according to an embodiment of the disclosure.
Figure 4:
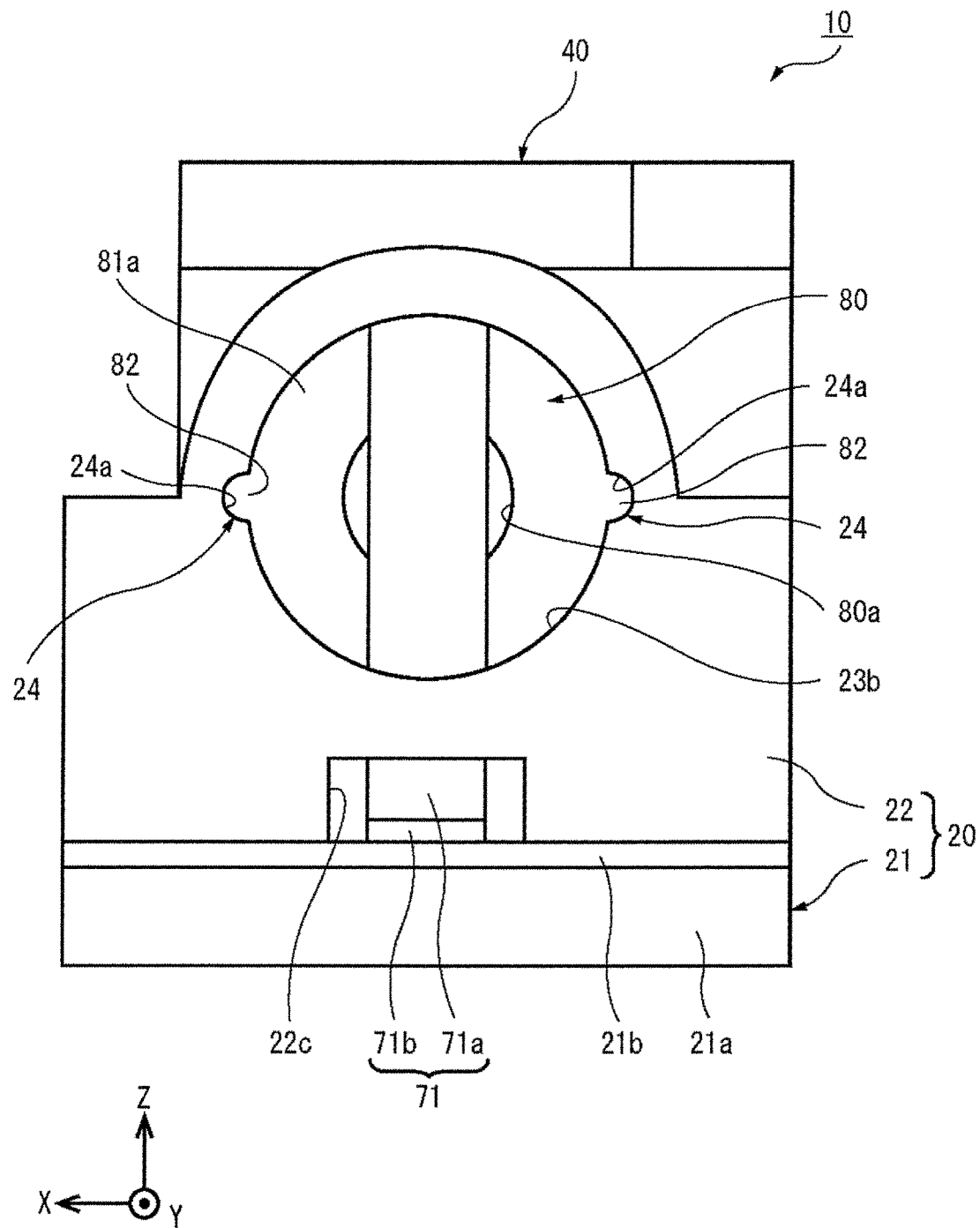
FIG. 4 is a view of the valve device mounted with the sensor unit according to an embodiment of the disclosure, as viewed from the front side.

FIG. 1 is a perspective view showing a configuration of a valve device 10 mounted with a sensor unit 40 according to an embodiment of the disclosure. FIG. 2 is an exploded perspective view showing the configuration of the valve device 10. FIG. 3 is a cross-sectional view taken along the line III-III of FIG. 1. FIG. 4 is a view of the valve device 10, as viewed from the front side. The valve device 10 shown in FIG. 1 to FIG. 4 is, for example, a control valve mounted on a vehicle. The valve device 10 includes an oil passage body 20, a spool valve 30, a magnet holder 80, a magnet 50, an elastic member 70, a fixing member 71, and the sensor unit 40. The sensor unit 40 of the present embodiment is a device that is fixed to the oil passage body 20 (spool housing body), which houses the spool valve 30, and detects the position of the spool valve 30. (Configuration of the Valve Device 10)

As shown in FIG. 3, the oil passage body 20 has an oil passage 10a inside, through which oil flows. The portion of the oil passage 10a shown in FIG. 3 is a part of a spool hole 23 which will be described later. Each figure shows a state where a part of the oil passage body 20 is cut out, for example. As shown in FIG. 1, the oil passage body 20 includes a lower body 21 and an upper body 22. Although not shown, the oil passage 10a is provided, for example, in both the lower body 21 and the upper body 22.

The lower body 21 includes a lower body main body 21a and a separate plate 21b disposed and stacked on the upper side of the lower body main body 21a. In the present embodiment, the upper surface of the lower body 21 corresponds to the upper surface of the separate plate 21b and is orthogonal to the vertical direction Z. The upper body 22 is disposed and stacked on the upper side of the lower body 21. The lower surface of the upper body 22 is orthogonal to the vertical direction Z. The lower surface of the upper body 22 is in contact with the upper surface of the lower body 21, that is, the upper surface of the separate plate 21b.

As shown in FIG. 3, the upper body 22 has the spool hole 23 that extends in the axial direction Y. In the present embodiment, the cross-sectional shape of the spool hole 23, which is orthogonal to the axial direction Y, is a circular shape centered on the central axis J. The central axis J extends in the axial direction Y. In addition, the radial direction centered on the central axis J is simply called the "radial direction" and the circumferential direction centered on the central axis J is simply called the "circumferential direction".

The spool hole 23 opens at least on the front side. In the present embodiment, the rear end of the spool hole 23 is closed. That is, the spool hole 23 is a hole that opens on the front side and has a bottom. Nevertheless, the spool hole 23 may open on both sides in the axial direction Y, for example. At least a part of the spool hole 23 constitutes a part of the oil passage 10a in the oil passage body 20.

The spool hole 23 has a spool hole main body 23a and an introduction hole 23b. Although not shown, the oil passage 10a provided in a portion other than the spool hole 23 in the oil passage body 20 opens on the inner circumferential surface of the spool hole main body 23a. The inner diameter of the introduction hole 23b is larger than the inner diameter of the spool hole main body 23a. The introduction hole 23b is connected to the front end of the spool hole main body 23a. The introduction hole 23b is the front end of the spool hole 23 and opens on the front side.

As shown in FIG. 1, the spool hole 23 has grooves 24 that are recessed from the inner circumferential surface of the spool hole 23 toward the outer side in the radial direction Y and extend in the radial direction Y. In the present embodiment, the grooves 24 are provided in pair on both sides of the central axis J. The pair of grooves 24 is recessed from the inner circumferential surface of the introduction hole 23b toward both sides in the left-right direction X. The groove 24 is provided from the front end of the inner circumferential surface of the introduction hole 23b to the rear end of the inner circumferential surface of the introduction hole 23b. As shown in FIG. 4, an inner surface 24a of the groove 24 has a semicircular shape which is concaved from the inner circumferential surface of the introduction hole 23b toward the outer side in the radial direction, as viewed from the front side.

As shown in FIG. 3, the upper body 22 has through holes 22a, 22b, and 22c at the front end of the upper body 22. The through hole 22a penetrates a portion of the upper body 22 from the upper surface of the upper body 22 to the inner circumferential surface of the introduction hole 23b in the vertical direction Z. The through hole 22b penetrates a portion of the upper body 22 from the lower surface of the upper body 22 to the inner circumferential surface of the introduction hole 23b in the vertical direction Z. As shown in FIG. 1, the through hole 22a and the through hole 22b each have a rectangular shape that is elongated in the left-right direction X, as viewed from the upper side. The through hole 22a and the through hole 22b overlap each other, as viewed from the upper side.

As shown in FIG. 3, the through hole 22c penetrates a portion of the upper body 22 from the front surface of the upper body 22 to the through hole 22b in the axial direction Y. The through hole 22c is provided at the lower end of the front surface of the upper body 22. The through hole 22c opens on the lower side. As shown in FIG. 4, the through hole 22c has a rectangular shape that is elongated in the left-right direction X, as viewed from the front side. The centers of the through holes 22a, 22b, and 22c in the left-right direction X is, for example, the same as the position of the central axis J in the left-right direction X.

As shown in FIG. 1, the upper body 22 includes a protrusion 22d that protrudes one step toward the upper side with respect to the other portions. The protrusion 22d has a step part 22e positioned at the front end, and a flat surface part 22f positioned on the rear side of the step part 22e. The upper surface of the step part 22e is a semicircular curved surface that is convex toward the upper side. The upper surface of the flat surface part 22f is a flat surface parallel to the left-right direction X and the axial direction Y, and the sensor unit 40 is mounted on the upper surface of the flat surface part 22f. Also, the upper end of the curved surface of the step part 22e is higher than the flat surface part 22f and protrudes toward the upper side with respect to the flat surface part 22f. The sensor unit 40 is positioned with a contact part 41b of the sensor unit 40 against the rear end surface of the upper end of the step part 22e, and is fixed to the flat surface part 22f.

The through hole 22a opens at the upper end of the semicircular curved surface of the step part 22e. The lower body main body 21a, the separate plate 21b, and the upper body 22 are single members respectively, for example. The lower body main body 21a, the separate plate 21b, and the upper body 22 are made of a non-magnetic material.

As shown in FIG. 3, the spool valve 30 is disposed along the central axis J that extends in the axial direction Y which intersects the vertical direction Z. The spool valve 30 has a columnar shape. The spool valve 30 is attached to the oil passage body 20. The spool valve 30 is disposed to be movable in the axial direction Y in the spool hole 23.

The spool valve 30 moves in the axial direction Y in the spool hole main body 23a to open/close the opening of the oil passage 10a that opens on the inner circumferential surface of the spool hole main body 23a. Although not shown, a forward force is applied from a drive device such as an oil hydraulic or solenoid actuator to the rear end of the spool valve 30. The spool valve 30 has a support part 31a, a plurality of large diameter parts 31b, and a plurality of small diameter parts 31c. Each part of the spool valve 30 has a columnar shape that is centered on the central axis J and extends in the axial direction Y.

The support part 31a is the front end of the spool valve 30. The front end of the support part 31a supports the rear end of a magnet holder 80. The rear end of the support part 31a is connected to the front end of the large diameter part 31b.

The large diameter parts 31b and the small diameter parts 31c are disposed alternately in a row from the large diameter part 31b connected to the rear end of the support part 31a toward the rear side. The outer diameter of the large diameter part 31b is larger than the outer diameter of the small diameter part 31c. In the present embodiment, the outer diameter of the support part 31a and the outer diameter of the small diameter part 31c are the same, for example. The outer diameter of the large diameter part 31b is approximately the same as the inner diameter of the spool hole main body 23*a* and slightly smaller than the inner diameter of the spool hole main body 23*a*. The large diameter part 31*b* can move in the axial direction Y while sliding on the inner circumferential surface of the spool hole main body 23*a*. The large diameter part 31*b* functions as a valve for opening/closing the opening of the oil passage 10*a* that opens on the inner circumferential surface of the spool hole main body 23*a*. In the present embodiment, the spool valve 30 is, for example, a single member made of metal.

The magnet holder 80 is disposed on the front side of the spool valve 30. The magnet holder 80 is disposed to be movable in the axial direction Y inside the introduction hole 23*b*. The spool valve 30 and the magnet holder 80 are allowed to rotate relative to each other around the central axis. As shown in FIG. 2, the magnet holder 80 includes a holder main body part 81 and opposite parts 82.

The holder main body part 81 has a stepped columnar shape that is centered on the central axis J and extends in the axial direction Y. As shown in FIG. 3, the holder main body part 81 is disposed in the spool hole 23. More specifically, the holder main body part 81 is disposed in the introduction hole 23*b*. The holder main body part 81 has a sliding part 81*a* and a supported part 81*b*. That is, the magnet holder 80 has the sliding part 81*a* and the supported part 81*b*.

The outer diameter of the sliding part 81*a* is larger than the outer diameter of the large diameter part 31*b*. The outer diameter of the sliding part 81*a* is approximately the same as the inner diameter of the introduction hole 23*b* and slightly smaller than the inner diameter of the introduction hole 23*b*. The sliding part 81*a* can move in the axial direction Y while sliding on the inner circumferential surface of the spool hole 23, that is, the inner circumferential surface of the introduction hole 23*b* in the present embodiment. The outer edge in the radial direction of the rear surface of the sliding part 81*a* can come into contact with a stepped surface, which faces the front side, of the step formed between the spool hole main body 23*a* and the introduction hole 23*b*. As a result, the magnet holder 80 can be prevented from moving toward the rear side from the position where the magnet holder 80 and the stepped surface are in contact with each other, and the terminal end position of the magnet holder 80 can be determined. As will be described later, since the spool valve 30 receives the rearward force from the elastic member 70 via the magnet holder 80, by determining the terminal end position of the magnet holder 80, the terminal end position of the spool valve 30 can be determined.

The supported part 81*b* is connected to the rear end of the sliding part 81*a*. The outer diameter of the supported part 81*b* is smaller than the outer diameter of the sliding part 81*a* and the outer diameter of the large diameter part 31*b* and larger than the outer diameter of the support part 31*a* and the outer diameter of the small diameter part 31*c*. The supported part 81*b* can move in the spool hole main body 23*a*. The supported part 81*b* moves in the axial direction Y between the introduction hole 23*b* and the spool hole main body 23*a* along with the movement of the spool valve 30 in the axial direction Y.

The supported part 81*b* has a supported concave part 80*b* that is recessed toward the front side from the rear end of the supported part 81*b*. The support part 31*a* is inserted into the supported concave part 80*b*. The front end of the support part 31*a* is in contact with the bottom surface of the supported concave part 80*b*. Thus, the magnet holder 80 is supported by the spool valve 30 from the rear side. The dimension of the supported part 81*b* in the axial direction Y is smaller than the dimension of the sliding part 81*a* in the axial direction Y, for example.

As shown in FIG. 2, the opposite parts 82 protrude from the holder main body part 81 toward the outer side in the radial direction. More specifically, the opposite parts 82 protrude from the sliding part 81*a* toward the outer side in the radial direction. In the present embodiment, the opposite parts 82 are provided in pair on both sides of the central axis J. The pair of opposite parts 82 protrudes toward both sides in the left-right direction X from the outer circumferential surface of the sliding part 81*a*. The opposite parts 82 extend in the axial direction Y from the front end of the sliding part 81*a* to the rear end of the sliding part 81*a*. As shown in FIG. 4, the opposite part 82 has a semicircular shape that is convex toward the outer side in the radial direction, as viewed from the front side.

The pair of opposite parts 82 is fitted to the pair of grooves 24. The opposite part 82 faces an inner surface 24*a* of the groove 24 in the circumferential direction and is in contact with the inner surface 24*a*. In this specification, "two certain portions face each other in the circumferential direction" includes a case where two certain portions are both positioned on one virtual circle along the circumferential direction and face each other.

As shown in FIG. 3, the magnet holder 80 has a first concave part 81*c* that is recessed toward the inner side in the radial direction from the outer circumferential surface of the sliding part 81*a*. In FIG. 3, the first concave part 81*c* is recessed toward the lower side from the upper end of the sliding part 81*a*. The inner surfaces of the first concave part 81*c* include a pair of surfaces facing the axial direction Y.

The magnet holder 80 has a second concave part 80*a* that is recessed toward the rear side from the front end of the magnet holder 80. The second concave part 80*a* extends from the sliding part 81*a* to the supported part 81*b*. As shown in FIG. 2, the second concave part 80*a* has a circular shape centered on the central axis J, as viewed from the front side. As shown in FIG. 3, the inner diameter of the second concave part 80*a* is larger than the inner diameter of the supported concave part 80*b*.

The magnet holder 80 may be made of resin or metal, for example. If the magnet holder 80 is made of resin, the magnet holder 80 can be easily manufactured. Moreover, the manufacturing cost of the magnet holder 80 can be reduced. If the magnet holder 80 is made of metal, the dimensional accuracy of the magnet holder 80 can be improved.

As shown in FIG. 2, the magnet 50 has a substantially rectangular parallelepiped shape. The upper surface of the magnet 50 is, for example, a surface curved in an arc shape along the circumferential direction. As shown in FIG. 3, the magnet 50 is housed in the first concave part 81*c* and fixed to the holder main body part 81. Thereby, the magnet 50 is fixed to the magnet holder 80. The magnet 50 is fixed by an adhesive, for example. The outer surface in the radial direction of the magnet 50 is positioned on the inner side in the radial direction with respect to the outer circumferential surface of the sliding part 81*a*. The outer surface in the radial direction of the magnet 50 faces the inner circumferential surface of the introduction hole 23*b* with a gap in the radial direction.

As described above, the sliding part 81*a* provided with the first concave part 81*c* moves while sliding on the inner circumferential surface of the spool hole 23. Therefore, the outer circumferential surface of the sliding part 81*a* and the inner circumferential surface of the spool hole 23 are in contact with each other or face each other with a slight gap. As a result, foreign substances such as metal pieces contained in the oil do not easily enter the first concave part 81c. Accordingly, it is possible to prevent foreign substances such as metal pieces contained in the oil from attaching to the magnet 50 housed in the first concave part 81c. If the magnet holder 80 is made of metal, the dimensional accuracy of the sliding part 81a can be improved, so foreign substances such as metal pieces contained in the oil are less likely to enter the first concave part 81c.

As shown in FIG. 2, the fixing member 71 has a plate shape with the plate surface parallel to the left-right direction X. The fixing member 71 has an extended part 71a and a bent part 71b. The extended part 71a extends in the vertical direction Z. The extended part 71a has a rectangular shape that is elongated in the vertical direction Z, as viewed from the front side. As shown in FIG. 1 and FIG. 3, the extended part 71a is inserted into the introduction hole 23b via the through hole 22b. The upper end of the extended part 71a is inserted into the through hole 22a. The extended part 71a closes a part of the opening on the front side of the introduction hole 23b. The bent part 71b is bent toward the front side from the lower end of the extended part 71a. The bent part 71b is inserted into the through hole 22c. The fixing member 71 is disposed on the front side of the elastic member 70.

In the present embodiment, the fixing member 71 is inserted from the opening of the through hole 22b, which opens on the lower surface of the upper body 22, to the through hole 22a via the through hole 22b and the introduction hole 23b before overlapping the upper body 22 and the lower body 21. Then, as shown in FIG. 1, the upper body 22 and the lower body 21 are stacked and combined in the vertical direction Z, by which the bent part 71b inserted into the through hole 22c is supported by the upper surface of the lower body 21 from the lower side. Thereby, the fixing member 71 can be attached to the oil passage body 20.

As shown in FIG. 3, the elastic member 70 is a coil spring that extends in the axial direction Y. The elastic member 70 is disposed on the front side of the magnet holder 80. In the present embodiment, at least a part of the elastic member 70 is disposed in the second concave part 80a. Therefore, at least a part of the elastic member 70 can overlap the magnet holder 80 in the radial direction, and the dimension of the valve device 10 in the axial direction Y can be easily reduced. In the present embodiment, the rear portion of the elastic member 70 is disposed in the second concave part 80a.

The rear end of the elastic member 70 is in contact with the bottom surface of the second concave part 80a. The front end of the elastic member 70 is in contact with the fixing member 71. Thus, the front end of the elastic member 70 is supported by the fixing member 71. The fixing member 71 receives a forward elastic force from the elastic member 70, and the extended part 71a is pressed against the inner surfaces on the front side of the through holes 22a and 22b.

The front end of the elastic member 70 is supported by the fixing member 71, by which the elastic member 70 applies a rearward elastic force to the spool valve 30 via the magnet holder 80. Therefore, the position of the spool valve 30 in the axial direction Y can be maintained at a position where the force applied from the drive device such as an oil hydraulic or solenoid actuator to the rear end of the spool valve 30 balances the elastic force of the elastic member 70, for example. Thus, by changing the force applied to the rear end of the spool valve 30, the position of the spool valve 30 in the axial direction Y can be changed to switch the opening/closing of the oil passage 10a inside the oil passage body 20.

Also, with the force applied from the drive device such as an oil hydraulic or solenoid actuator to the rear end of the spool valve 30 and the elastic force of the elastic member 70, the magnet holder 80 and the spool valve 30 can be pressed against each other in the axial direction Y. Therefore, the magnet holder 80 is allowed to rotate around the central axis with respect to the spool valve 30 and moves in the axial direction Y along with the movement of the spool valve 30 in the axial direction Y.

The sensor unit 40 is a device for detecting the position of the spool valve 30. As described above, the sensor unit 40 of the present embodiment is positioned with the contact part 41b of the sensor unit 40 against the rear end surface of the upper end of the step part 22e, and is fixed to the flat surface part 22f. Hereinafter, the configuration of the sensor unit 40 according to an embodiment of the disclosure will be described in detail.

(Configuration of the Sensor Unit 40)

Figure 5:
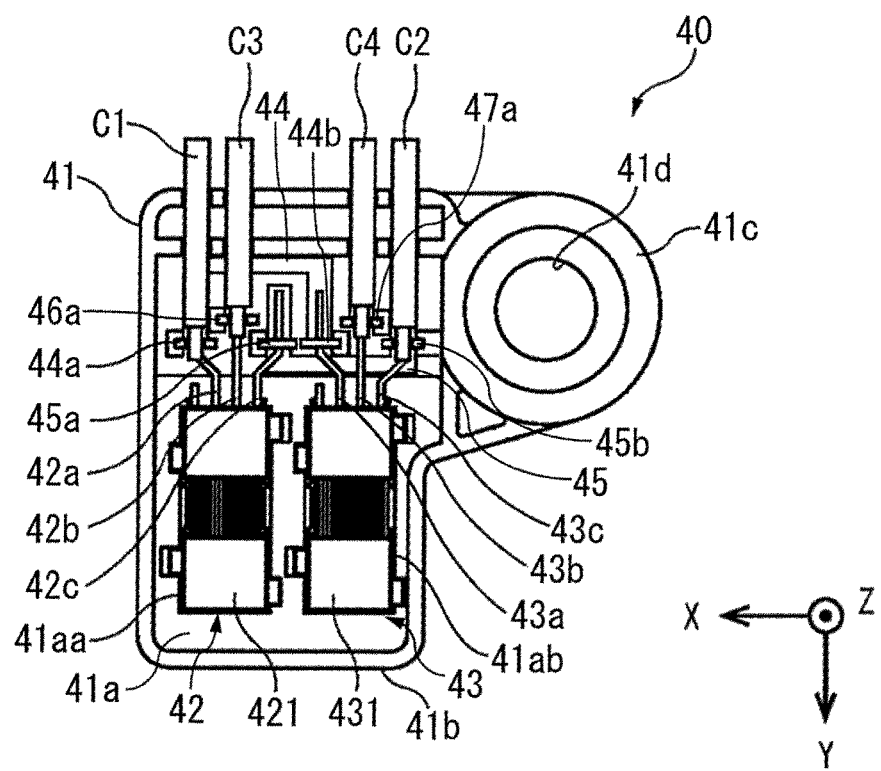
FIG. 5 is a plan view showing a configuration of the sensor unit according to an embodiment of the disclosure.
Figure 6:
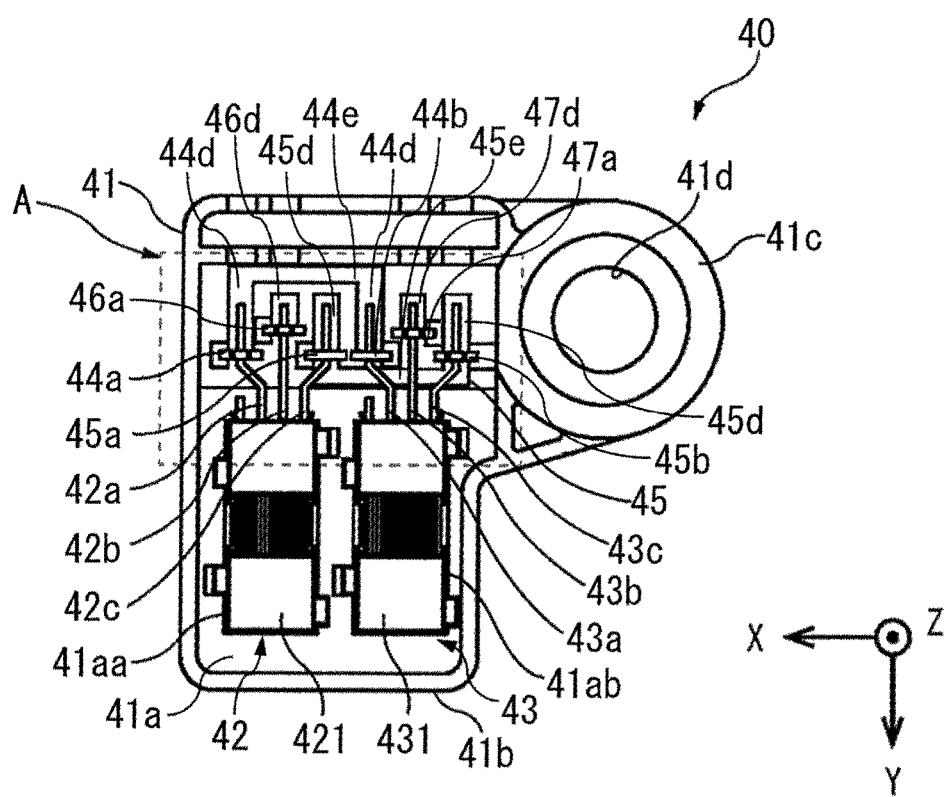
FIG. 6 is a plan view showing a state where the cables are removed from the sensor unit of FIG. 5.
Figure 7:
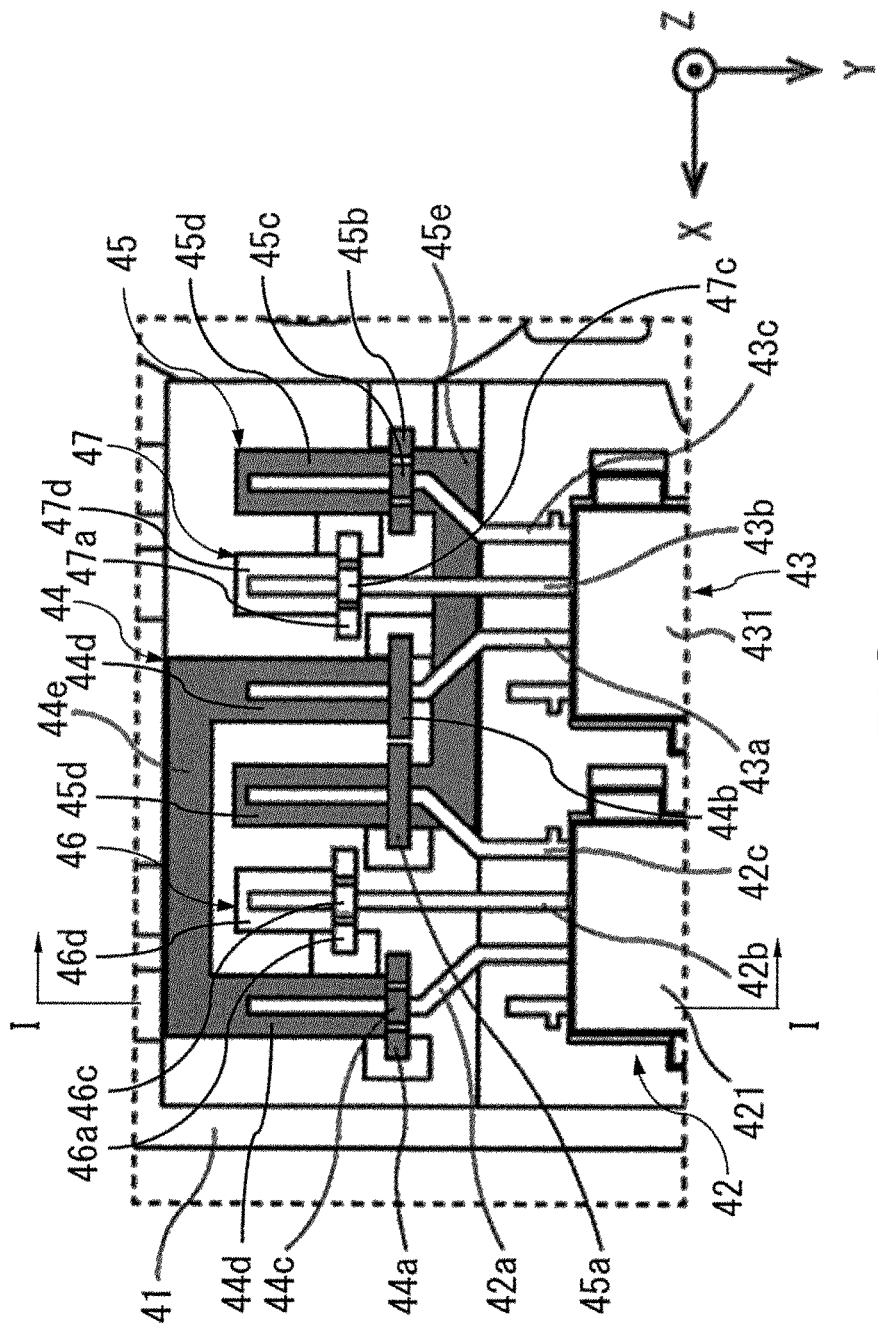
FIG. 7 is an enlarged view of the portion A (the portion surrounded by the broken line) of FIG. 6.
Figure 8:
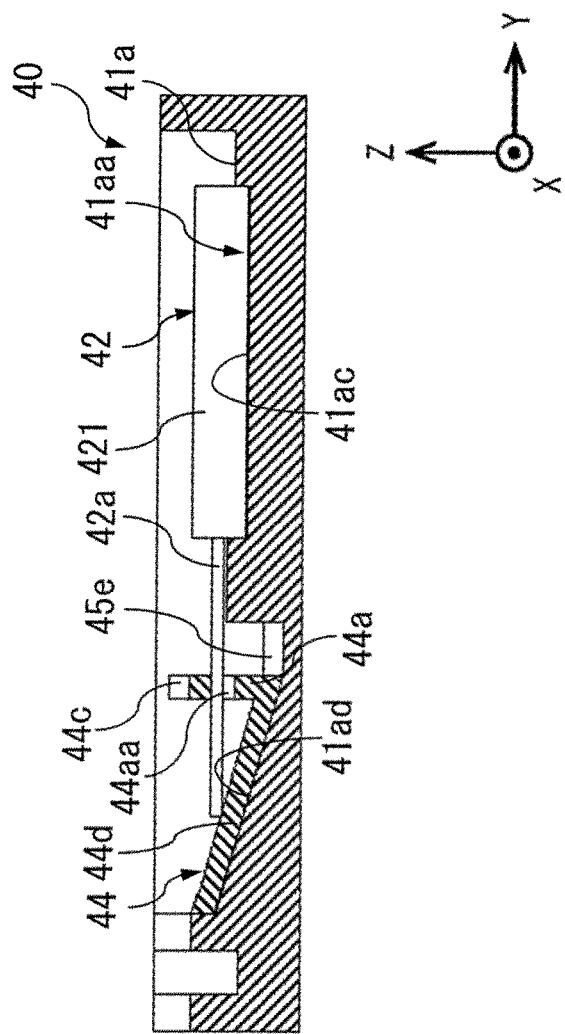
FIG. 8 is a cross-sectional view taken along the line I-I of FIG. 7.

FIG. 5 is a plan view showing the configuration of the sensor unit 40 of the present embodiment. The sensor unit 40 includes a case 41, two magnetic sensors 42 and 43 (sensor elements), a power supply bus bar 44, a ground bus bar 45, and output bus bars 46 and 47. The sensor unit 40 is connected with a cable C1, which is electrically connected to the power supply bus bar 44 and supplies power to the power supply terminals 42a and 43a of the magnetic sensors 42 and 43. The sensor unit 40 is connected with a cable C2, which is electrically connected to the ground bus bar 45 and grounds the ground terminals 42c and 43c of the magnetic sensors 42 and 43. Further, the sensor unit 40 is connected with cables C3 and C4, which are respectively connected to the output bus bars 46 and 47 and output the outputs of the magnetic sensors 42 and 43 to the outside. FIG. 6 is a plan view showing a state where the cables C1 to C4 are removed from the sensor unit 40 of FIG. 5. FIG. 7 is an enlarged view of a portion A (the portion surrounded by the broken line) of FIG. 6. FIG. 8 is a cross-sectional view taken along the line I-I of FIG. 7. In FIG. 7, the power supply bus bar 44 and the ground bus bar 45 are shown in gray to make the figure easy to read.

The case 41 has a bottom and a side wall surrounding the edge of the bottom (bottom surface 41a), and is a rectangular parallelepiped box-shaped case that is flat in the vertical direction Z. The case 41 has an upper opening and houses the components of the sensor unit 40 in the space inside. Moreover, the case 41 has a fixing part 41c that extends in parallel to the flat surface part 22f from the right end surface of the case 41. The fixing part 41c has a through hole 41d that penetrates in the vertical direction Z at substantially the center of the fixing part 41c. When the sensor unit 40 is attached to the upper body 22, the case 41 is disposed on the flat surface part 22f, and the contact part 41b, which is the front end surface of the case 41, is placed against the rear end surface of the upper end of the step part 22e. At this time, the through hole 41d is disposed on the upper side of a screw hole (not shown) of the flat surface part 22f. Therefore, the case 41 is fixed to the flat surface part 22f by inserting a fixing screw 90 into the through hole 41d and fixing the fixing screw 90 to the screw hole (not shown) of the flat surface part 22f (FIG. 1). In addition, when the fixing screw 90 is rotated, a stress in the rotational direction, which is centered on the through hole 41d, is applied to the sensor unit 40. In the present embodiment, since the contact part 41b of the case 41 is in contact with the rear end surface of the upper end of the step part 22e, the sensor unit 40 does not rotate with the rotation of the fixing screw 90. In other words, the sensor unit 40 is fixed by one fixing screw 90, and the step part 22e functions as a rotation stopper of the sensor unit 40.

As shown in FIG. 3, FIG. 5, and FIG. 6, the magnetic sensors 42 and 43 (sensor element main bodies 421 and 431) are respectively housed in the sensor housing parts 41aa and 41ab that are recessed on the bottom surface 41a of the case 41. In the present embodiment, as shown in FIG. 8, the bottom surfaces of the sensor housing parts 41aa and 41ab constitute a mounting surface 41ac for mounting the sensor element main bodies 421 and 431. In a state where the sensor element main bodies 421 and 431 are housed (mounted) in the sensor housing parts 41aa and 41ab, the movement of the sensor element main bodies 421 and 431 in a direction parallel to the mounting surface 41ac is restricted. In addition, the magnetic sensors 42 and 43 are fixed to the case 41 by a molding resin 49. The molding resin 49 is, for example, an epoxy resin and is filled in the entire space in the case 41, as shown in FIG. 1. Nevertheless, the molding resin 49 may be partially applied to cover the upper sides of the magnetic sensors 42 and 43. In FIG. 5 to FIG. 8, the molding resin 49 is omitted to make the figures easy to read.

The magnetic sensors 42 and 43 are sensor elements for detecting the magnetic field of the magnet 50. The magnetic sensors 42 and 43 are Hall elements, for example. The magnetic sensors 42 and 43 may be magnetic resistance elements. In the present embodiment, the magnetic sensors 42 and 43 are disposed side by side in the left-right direction X on the upper side of the magnet 50 (FIG. 3 and FIG. 5). As shown in FIG. 6 and FIG. 7, the magnetic sensor 42 includes the sensor element main body 421, a power supply terminal 42a, a signal terminal 42b, and a ground terminal 42c, wherein the power supply terminal 42a, the signal terminal 42b, and the ground terminal 42c are electrically connected to the sensor element main body 421 at the front ends and extend toward the rear side. In addition, the magnetic sensor 43 includes the sensor element main body 431, a power supply terminal 43a, a signal terminal 43b, and a ground terminal 43c, wherein the power supply terminal 43a, the signal terminal 43b, and the ground terminal 43c are electrically connected to the sensor element main body 431 at the front ends and extend toward the rear side.

For example, copper, aluminum, or an alloy containing these may be used as the material for forming these terminals 42a to 42c and 43a to 43c. In addition, the shape of the cross section (the cross section along a direction orthogonal to the axial direction Y) of each of the terminals 42a to 42c and 43a to 43c may be circular, elliptical, rectangular, square or the like. With this configuration, the terminals 42a to 42c and 43a to 43c have high rigidity.

The power supply bus bar 44 is a common electrical connection member for supplying power to the power supply terminal 42a of the magnetic sensor 42 and the power supply terminal 43a of the magnetic sensor 43. The power supply bus bar 44 is a member obtained by machining a thin plate of metal (for example, copper) and has a substantially U shape when viewed from the vertical direction Z (in the plan view). The power supply bus bar 44 includes a first connection part 44a (terminal passage part) electrically connected to the power supply terminal 42a, and a second connection part 44b (terminal passage part) electrically connected to the power supply terminal 43a. The first connection part 44a and the second connection part 44b are plate-shaped parts that rise toward the upper side from the bottom surface 41a respectively. The first connection part 44a and the second connection part 44b are spaced apart in the left-right direction X, but are positioned substantially in a straight line along the left-right direction X.

As shown in FIG. 8, an inclined surface 41ad that is inclined with respect to the mounting surface 41ac is formed on the rear side of the sensor housing part 41aa of the bottom surface 41a. The inclined surface 41ad is inclined so that the thickness of the bottom of the case 41 decreases continuously from the rear side toward the front side. The power supply bus bar 44, the ground bus bar 45, and the output bus bars 46 and 47 are disposed on the inclined surface 41ad and fixed by an adhesive or the like, for example.

The power supply bus bar 44 includes a pair of inclined parts 44d disposed along the inclination direction (the front-rear direction Y) of the inclined surface 41ad, and a connection part 44e disposed along a direction (the left-right direction X) orthogonal to the inclination direction of the inclined surface 41ad and connecting the rear ends of the inclined parts 44d to each other. In addition, the first connection part 44a is provided at the front end of one inclined part 44d, and the second connection part 44b is provided at the front end of the other inclined part 44d.

A through hole 44aa that allows the power supply terminal 42a to pass through is formed to penetrate the first connection part 44a in the thickness direction (the front-rear direction Y). In a state where the power supply terminal 42a is disposed through the first connection part 44a (the through hole 44aa), the rear end of the power supply terminal 42a is in contact with one inclined part 44d and the first connection part 44a is in contact with the side surface of the power supply terminal 42a, so that the movement of the power supply terminal 42a in a direction away from the bottom surface 41a is restricted. With this configuration, it is possible to ensure the electrical connection between the rear end of the power supply terminal 42a and the inclined part 44d. Moreover, in the present embodiment, the power supply terminal 42a is designed to have a predetermined length and the rear end thereof is in contact with the inclined part 44d to be pressed in a direction away from the bottom surface 41a. Thus, the electrical connection is further ensured.

Then, the power supply terminal 42a and the inclined part 44d are welded (for example, laser welded) at a point where the rear end of the power supply terminal 42a is in contact with the inclined part 44d. At this time, the rear end of the power supply terminal 42a is pressed in the direction away from the bottom surface 41a, that is, the rear end of the power supply terminal 42a is in close contact with the inclined part 44d, so the power supply terminal 42a and the inclined part 44d can be welded more easily and accurately. As a result, it is possible to prevent formation of pinholes in the welded part and achieve high connection reliability between the power supply terminal 42a and the inclined part 44d (the power supply bus bar 44).

In addition, a high degree of close contact between the rear end of the power supply terminal 42a and the inclined part 44d can be realized without using a press-in method or a jig. Therefore, it is also possible to reduce the man-hours for laser welding the rear end of the power supply terminal 42a and the inclined part 44d. Moreover, the first connection part 44a has a concave part 44c that is recessed toward the lower side in the central part of the left-right direction X. The core wire of the cable C1 is soldered and electrically connected to the concave part 44c (FIG. 5).

Similarly, a through hole (not shown) that allows the power supply terminal 43a to pass through is also formed to penetrate the second connection part 44b in the thickness direction. In a state where the power supply terminal 43a is disposed through the second connection part 44*b* (through hole), the rear end of the power supply terminal 43*a* is in contact with the other inclined part 44*d* and the second connection part 44*b* is in contact with the side surface of the power supply terminal 43*a*, so that the movement of the power supply terminal 43*a* in a direction away from the bottom surface 41*a* is restricted. The effects achieved by this configuration are the same as described above. Then, the power supply terminal 43*a* and the inclined part 44*d* are welded (for example, laser welded) at a point where the rear end of the power supply terminal 43*a* is in contact with the inclined part 44*d*.

The ground bus bar 45 is a common electrical connection member for grounding the ground terminal 42*c* of the magnetic sensor 42 and the ground terminal 43*c* of the magnetic sensor 43. The ground bus bar 45 is a member obtained by machining a thin plate of metal (for example, copper) and has a substantially U shape when viewed from the vertical direction Z (in the plan view). The ground bus bar 45 includes a first connection part 45*a* (terminal passage part) electrically connected to the ground terminal 42*c*, and a second connection part 45*b* (terminal passage part) electrically connected to the ground terminal 43*c*. The first connection part 45*a* and the second connection part 45*b* are plate-shaped parts that rise toward the upper side from the bottom surface 41*a* respectively. The first connection part 45*a* and the second connection part 45*b* are spaced apart in the left-right direction X, but are positioned substantially in a straight line along the left-right direction X.

The ground bus bar 45 includes a pair of inclined parts 45*d* disposed along the inclination direction (the front-rear direction Y) of the inclined surface 41*ad*, and a connection part 45*e* disposed along a direction (the left-right direction X) orthogonal to the inclination direction of the inclined surface 41*ad* and connecting the front ends of the inclined parts 45*d* to each other. In addition, the first connection part 45*a* is provided at the front end of one inclined part 45*d*, and the second connection part 45*b* is provided at the front end of the other inclined part 45*d*.

A through hole (not shown) that allows the ground terminal 42*c* to pass through is formed to penetrate the first connection part 45*a* in the thickness direction. In a state where the ground terminal 42*c* is disposed through the first connection part 45*a* (through hole), the rear end of the ground terminal 42*c* is in contact with one inclined part 45*d* and the first connection part 45*a* is in contact with the side surface of the ground terminal 42*c*, so that the movement of the ground terminal 42*c* in a direction away from the bottom surface 41*a* is restricted. The effects achieved by this configuration are the same as described above. Then, the ground terminal 42*c* and the inclined part 45*d* are welded (for example, laser welded) at a point where the rear end of the ground terminal 42*c* is in contact with the inclined part 45*d*.

Similarly, a through hole (not shown) that allows the ground terminal 43*c* to pass through is also formed to penetrate the second connection part 45*b* in the thickness direction. In a state where the ground terminal 43*c* is disposed through the second connection part 45*b* (through hole), the rear end of the ground terminal 43*c* is in contact with the other inclined part 45*d* and the second connection part 45*b* is in contact with the side surface of the ground terminal 43*c*, so that the movement of the ground terminal 43*c* in a direction away from the bottom surface 41*a* is restricted. The effects achieved by this configuration are the same as described above. Then, the ground terminal 43*c* and the inclined part 45*d* are welded (for example, laser welded) at a point where the rear end of the ground terminal 43*c* is in contact with the inclined part 45*d*. Moreover, the second connection part 45*b* has a concave part 45*c* that is recessed toward the lower side in the central part of the left-right direction X. The core wire of the cable C2 is soldered and electrically connected to the concave part 45*c* (FIG. 5).

The output bus bar 46 is an electrical connection member electrically connected to the signal terminal 42*b* of the magnetic sensor 42. The output bus bar 46 is a member obtained by machining a thin plate of metal (for example, copper) and has a substantially I shape when viewed from the vertical direction Z (in the plan view). The output bus bar 46 includes an inclined part 46*d* disposed along the inclination direction (the front-rear direction Y) of the inclined surface 41*ad*, and a connection part 46*a* provided at the front end of the inclined part 46*d*. The connection part 46*a* is a plate-shaped part that rises toward the upper side from the bottom surface 41*a*.

A through hole (not shown) that allows the signal terminal 42*b* to pass through is formed to penetrate the connection part 46*a* in the thickness direction. In a state where the signal terminal 42*b* is disposed through the connection part 46*a* (through hole), the rear end of the signal terminal 42*b* is in contact with the inclined part 46*d* and the connection part 46*a* is in contact with the side surface of the signal terminal 42*b*, so that the movement of the signal terminal 42*b* in a direction away from the bottom surface 41*a* is restricted. The effects achieved by this configuration are the same as described above. Then, the signal terminal 42*b* and the inclined part 46*d* are welded (for example, laser welded) at a point where the rear end of the signal terminal 42*b* is in contact with the inclined part 46*d*. Moreover, the connection part 46*a* has a concave part 46*c* that is recessed toward the lower side in the central part of the left-right direction X. The core wire of the cable C3 is soldered and electrically connected to the concave part 46*c* (FIG. 5).

The output bus bar 47 is an electrical connection member electrically connected to the signal terminal 43*b* of the magnetic sensor 43. The output bus bar 47 is a member obtained by machining a thin plate of metal (for example, copper) and has a substantially I shape when viewed from the vertical direction Z (in the plan view). The output bus bar 47 includes an inclined part 47*d* disposed along the inclination direction (the front-rear direction Y) of the inclined surface 41*ad*, and a connection part 47*a* provided at the front end of the inclined part 47*d*. The connection part 47*a* is a plate-shaped part that rises toward the upper side from the bottom surface 41*a*.

A through hole (not shown) that allows the signal terminal 43*b* to pass through is formed to penetrate the connection part 47*a* in the thickness direction. In a state where the signal terminal 43*b* is disposed through the connection part 47*a* (through hole), the rear end of the signal terminal 43*b* is in contact with the inclined part 47*d* and the connection part 47*a* is in contact with the side surface of the signal terminal 43*b*, so that the movement of the signal terminal 43*b* in a direction away from the bottom surface 41*a* is restricted. The effects achieved by this configuration are the same as described above. Then, the signal terminal 43*b* and the inclined part 47*d* are welded (for example, laser welded) at a point where the rear end of the signal terminal 43*b* is in contact with the inclined part 47*d*. Moreover, the connection part 47*a* has a concave part 47*c* that is recessed toward the lower side in the central part of the left-right direction X. The core wire of the cable C4 is soldered and electrically connected to the concave part 47*c* (FIG. 5).

In the present embodiment, the output bus bar 46 and the output bus bar 47 are spaced apart in the left-right direction X, but the connection part 46a and the connection part 47a thereof are positioned substantially in a straight line along the left-right direction X. Also, in the present embodiment, the first connection part 44a and the second connection part 44b of the power supply bus bar 44 and the first connection part 45a and the second connection part 45b of the ground bus bar 45 are positioned substantially in a straight line along the left-right direction X. With this configuration, the process of disposing the terminals 42a to 42c and 43a to 43c of the magnetic sensors 42 and 43 through the corresponding connection parts 44a to 47a, 44b, and 45b of the bus bars 44 to 47 can be easily performed.

In addition, the rear ends of the terminals 42a to 42c and 43a to 43c are pressed in the direction away from the bottom surface 41a, by which the sensor element main bodies 421 and 431 are pressed in the direction toward the mounting surface 41ac with the contact parts between the terminals 42a to 42c and 43a to 43c and the connection parts 44a to 47a, 44b, and 45b (terminal passage parts) as the fulcrums. Therefore, it is possible to prevent the sensor element main bodies 421 and 431 from rising from the mounting surface 41ac. Accordingly, the welding, adhesion, or a jig for pressing the sensor element main bodies 421 and 431 against the mounting surface 41ac can be omitted, which contributes to simplification and cost reduction of the configuration of the sensor unit 40. In addition, since the sensor element main bodies 421 and 431 are prevented from rising from the mounting surface 41ac, the operation of sealing the magnetic sensors 42 and 43 with the molding resin 49 is facilitated.

In particular, since the connection parts 44a to 47a, 44b, and 45b are respectively provided at the front ends of the inclined parts 44d to 47d, a sufficient distance (moment arm) can be secured between the rear end of each of the terminals 42a to 42c and 43a to 43c and each of the connection parts 44a to 47a, 44b, and 45b. As a result, the force by which the sensor element main bodies 421 and 431 are pressed in the direction toward the mounting surface 41ac can be further increased. The shape of the through hole formed in each of the connection parts 44a to 47a, 44b, and 45b is the same as or similar to the shape of the cross section of each of the terminals 42a to 42c and 43a to 43c, and the opening area of each through hole is set slightly larger than the cross-sectional area of each terminal.

Furthermore, as shown in FIG. 7, the points where the rear ends of the terminals 42a to 42c and 43a to 43c are in contact with the inclined parts 44d to 47d are positioned substantially in a straight line when viewed from the direction orthogonal to the mounting surface 41ac (in the plan view). With this configuration, the workability at the time of laser welding can be improved.

Figure 9:
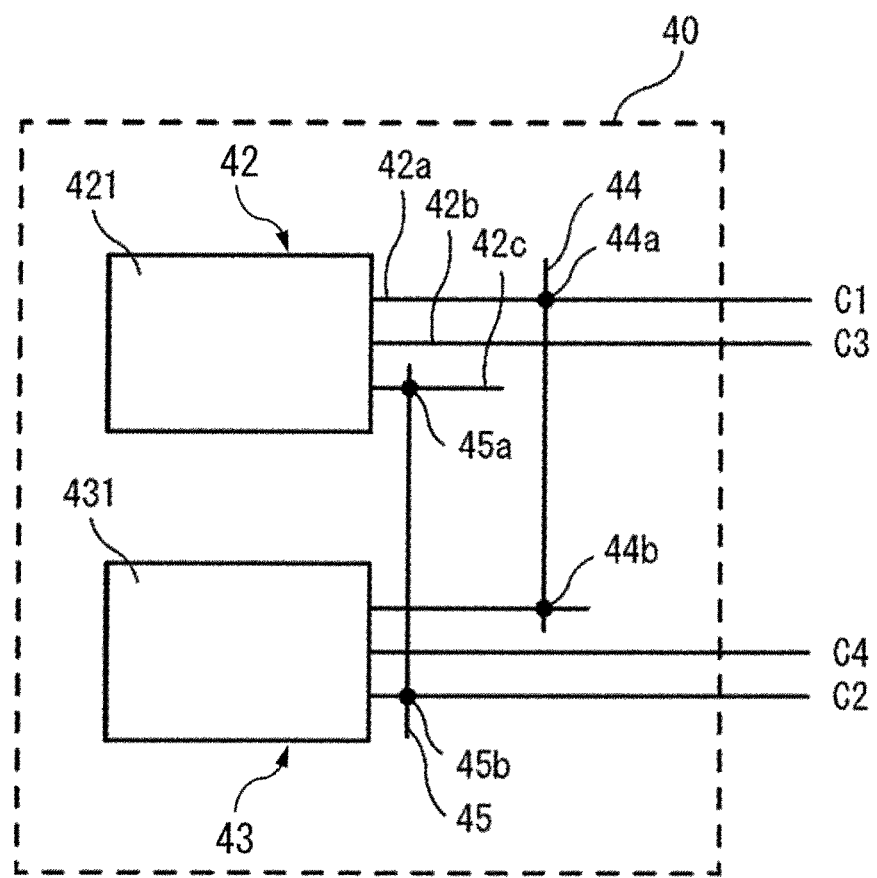
FIG. 9 is a circuit diagram of the sensor unit according to an embodiment of the disclosure.

FIG. 9 is a circuit diagram of the sensor unit 40. As shown in FIG. 9, since the common power supply bus bar 44 is connected to the power supply terminal 42a of the magnetic sensor 42 and the power supply terminal 43a of the magnetic sensor 43 in the present embodiment, one power supply cable C1 may be connected to the sensor unit 40. Moreover, since the common ground bus bar 45 is connected to the ground terminal 42c of the magnetic sensor 42 and the ground terminal 43c of the magnetic sensor 43, one grounding cable C2 may be connected to the sensor unit 40. Thus, the number of cables connected to the sensor unit 40 is reduced by using the power supply bus bar 44 and the ground bus bar 45 in the sensor unit 40 of the present embodiment. Therefore, although the sensor unit 40 is configured to include two magnetic sensors 42 and 43, it has a compact shape.

When the position of the magnet 50 in the axial direction Y changes with the movement of the spool valve 30 in the axial direction Y, the magnetic field of the magnet 50 that passes through the magnetic sensors 42 and 43 changes. Therefore, by using the magnetic sensors 42 and 43 to detect the change of the magnetic field of the magnet 50, the position of the magnet 50 in the axial direction Y, that is, the position of the magnet holder 80 in the axial direction Y can be detected. As described above, the magnet holder 80 moves in the axial direction Y along with the movement of the spool valve 30 in the axial direction Y. Therefore, the position of the spool valve 30 in the axial direction Y can be detected by detecting the position of the magnet holder 80 in the axial direction Y.

As described above, in the present embodiment, the two magnetic sensors 42 and 43 and the magnet 50 are disposed to overlap in the vertical direction Z. Thus, the magnetic sensors 42 and 43 respectively output position information of the magnet holder 80 in the axial direction Y. The valve device 10 constitutes a redundant system by using the two magnetic sensors 42 and 43. In other words, the valve device 10 detects the position of the spool valve 30 in the axial direction Y based on the outputs of the two magnetic sensors 42 and 43 of the sensor unit 40. Then, if any one of the two magnetic sensors 42 and 43 has a problem, the output of the other magnetic sensor is used to detect the position of the spool valve 30 in the axial direction Y. Thus, by using the sensor unit 40 of the present embodiment, the valve device 10 having a fail-safe structure is realized with a compact configuration.

Although the present embodiment has been described above, the disclosure is not limited to the above configuration, and it is possible to make various modifications within the scope of the technical concept of the disclosure.

For example, in the present embodiment, the two magnetic sensors 42 and 43 detect the position of the magnet 50 that moves along one direction (the axial direction Y) under the two magnetic sensors 42 and 43. However, the two magnetic sensors 42 and 43 may detect the position of the magnet 50 that rotates under the two magnetic sensors 42 and 43.

Further, the present embodiment illustrates a configuration that the magnetic field of the magnet 50 is detected by two magnetic sensors 42 and 43. However, the sensors used are not necessarily magnetic sensors if they can detect the position of the spool valve 30 in the axial direction Y. According to the configuration of the spool valve 30, other sensors such as light sensors and piezoelectric elements may also be used.

Although the sensor unit 40 of the present embodiment includes two magnetic sensors 42 and 43 in the case 41, the sensor unit 40 may include three or more magnetic sensors.

In addition, the present embodiment illustrates a configuration that the magnetic sensors 42 and 43 of the sensor unit 40 detect the position of one single spool valve 30 in the axial direction Y. However, two spool valves 30 may be disposed in parallel, and the magnetic sensors 42 and 43 may respectively detect the positions of the spool valves 30 in the axial direction Y, for example.

In the present embodiment, the power supply bus bar 44 and the ground bus bar 45 each have a substantially U shape in the plan view, but they are not limited to such a configuration. The power supply bus bar 44 and the ground bus bar 45 may each have a substantially I shape, for example, if they can be spaced apart at least in the axial direction Y and be parallel to each other.

Furthermore, the connection parts that connect the cables C1 to C4 may be provided at the rear ends of the inclined parts 44d to 47d, and in such a case, they may constitute a connector for collectively connecting the cables C1 to C4.

In addition, application of the valve device 10 of the present embodiment is not particularly limited, and the valve device 10 may be mounted on equipment other than a vehicle. Moreover, the configurations described above can be combined as appropriate to an extent that there is no contradiction.

What is claimed is:

1. A sensor unit, comprising:
   a case having a bottom surface that comprises a mounting surface, and a side wall that surrounds the bottom surface;
   a sensor element comprising a sensor element main body and a terminal, wherein the sensor element main body is mounted on the mounting surface in a state of being restricted from moving in a direction parallel to the mounting surface, and an end on one side of the terminal is electrically connected to the sensor element main body; and
   a bus bar comprising an inclined part and a terminal passage part, and fixed in the case, wherein the inclined part is inclined with respect to the mounting surface, and the terminal passes through the terminal passage part,
   wherein in a state where the terminal passes through the terminal passage part, an end on the other side of the terminal is in contact with the inclined part and the terminal passage part is in contact with a side surface of the terminal, so that movement of the terminal in a direction away from the bottom surface is restricted.

2. The sensor unit according to claim 1, wherein the end on the other side of the terminal is in contact with the inclined part to be pressed in the direction away from the bottom surface.

3. The sensor unit according to claim 1, wherein the terminal and the inclined part are welded at a point where the end on the other side of the terminal is in contact with the inclined part.

4. The sensor unit according to claim 1, wherein the end on the other side of the terminal is pressed in the direction away from the bottom surface, by which the sensor element main body is pressed in a direction toward the mounting surface with a contact part of the terminal and the terminal passage part as a fulcrum.

5. The sensor unit according to claim 1, wherein the terminal passage part is provided at the end on one side of the inclined part.

6. The sensor unit according to claim 1, wherein the sensor element comprises a plurality of the terminals,
   the sensor unit comprises a plurality of the inclined parts, and
   points where the ends on the other side of the terminals and the inclined parts are in contact with each other are positioned substantially in a straight line when viewed from a direction orthogonal to the mounting surface.

7. The sensor unit according to claim 1, wherein the sensor unit is fixed to a spool housing body that houses a spool valve, and the sensor element detects a position of the spool valve.

8. The sensor unit according to claim 7, wherein the sensor unit comprises a plurality of the sensor elements, and
   each of the sensor elements detects the position of one single spool valve.

9. The sensor unit according to claim 7, wherein the spool valve comprises a magnet at an end in a central axis direction, and
   the sensor element is a magnetic sensor that detects a magnetic field of the magnet.

* * * * *